United States Patent
Nakamura et al.

(10) Patent No.: US 9,449,856 B2
(45) Date of Patent: Sep. 20, 2016

(54) ENCAPSULANT WITH BASE FOR USE IN SEMICONDUCTOR ENCAPSULATION, SEMICONDUCTOR APPARATUS, AND METHOD FOR MANUFACTURING SEMICONDUCTOR APPARATUS

(71) Applicant: SHIN-ETSU CHEMICAL CO., LTD., Tokyo (JP)

(72) Inventors: Tomoaki Nakamura, Annaka (JP); Toshio Shiobara, Annaka (JP); Hideki Akiba, Annaka (JP); Susumu Sekiguchi, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/334,060

(22) Filed: Jul. 17, 2014

(65) Prior Publication Data

US 2015/0028497 A1    Jan. 29, 2015

(30) Foreign Application Priority Data

Jul. 29, 2013    (JP) ................. 2013-156470

(51) Int. Cl.
| | |
|---|---|
| H01L 23/28 | (2006.01) |
| H01L 21/56 | (2006.01) |
| H01L 23/00 | (2006.01) |
| H01L 23/31 | (2006.01) |

(52) U.S. Cl.
CPC ............ *H01L 21/561* (2013.01); *H01L 24/97* (2013.01); *H01L 23/3121* (2013.01); *H01L 2924/0002* (2013.01); *H01L 2924/12042* (2013.01); *H01L 2924/181* (2013.01); *Y10T 428/265* (2015.01); *Y10T 428/31504* (2015.04); *Y10T 428/31511* (2015.04); *Y10T 428/31663* (2015.04); *Y10T 428/31721* (2015.04); *Y10T 428/31855* (2015.04)

(58) Field of Classification Search
CPC . H01L 21/78; H01L 21/561; H01L 23/3107; H01L 24/97
USPC .................................. 257/787–795
See application file for complete search history.

(56) References Cited

U.S. PATENT DOCUMENTS

| | | |
|---|---|---|
| 2003/0127750 A1 | 7/2003 | Hacke et al. |
| 2011/0132449 A1* | 6/2011 | Ramadas et al. ............. 136/256 |
| 2012/0161339 A1 | 6/2012 | Sekiguchi et al. |

FOREIGN PATENT DOCUMENTS

| | | |
|---|---|---|
| JP | 05-283453 A | 10/1993 |
| JP | 09-232477 A | 9/1997 |
| JP | A-2002-179885 | 6/2002 |
| JP | A-2004-504723 | 2/2004 |
| JP | A-2007-001266 | 1/2007 |
| JP | A-2009-060146 | 3/2009 |
| JP | A-2012-151451 | 8/2012 |

OTHER PUBLICATIONS

Nov. 17, 2015 Office Action issued in Japanese Application No. 2013-156470.

* cited by examiner

*Primary Examiner* — Hung Vu
(74) *Attorney, Agent, or Firm* — Oliff PLC (57) ABSTRACT

The present invention provides an encapsulant with a base for use in semiconductor encapsulation, for collectively encapsulating a device mounting surface of a substrate on which semiconductor devices are mounted, or a device forming surface of a wafer on which semiconductor devices are formed, the encapsulant comprising the base, an encapsulating resin layer composed of an uncured or semi-cured thermosetting resin formed on one surface of the base, and a surface resin layer formed on the other surface of the base. The encapsulant enables a semiconductor apparatus having a good appearance and laser marking property to be manufactured.

14 Claims, 1 Drawing Sheet

ENCAPSULANT WITH BASE FOR USE IN SEMICONDUCTOR ENCAPSULATION, SEMICONDUCTOR APPARATUS, AND METHOD FOR MANUFACTURING SEMICONDUCTOR APPARATUS

BACKGROUND OF THE INVENTION

1. Field of the Invention

The present invention relates to an encapsulant capable of collectively encapsulating a device mounting surface of a substrate on which semiconductor devices have been mounted, or a device forming surface of a wafer on which semiconductor devices have been formed on a wafer level, particularly to an encapsulant with a base for use in semiconductor encapsulation, a semiconductor apparatus manufactured by the encapsulant with a base for use in semiconductor encapsulation, and a method for manufacturing the same.

2. Description of the Related Art

Various methods have heretofore been proposed and investigated about encapsulation, on a wafer level, of a device mounting surface of a substrate on which semiconductor devices have been mounted (also referred to as a semiconductor device mounting substrate, hereinafter), or a device forming surface of a wafer on which semiconductor devices have been formed (also referred to as a semiconductor device forming wafer, hereinafter), and there may be exemplified by a method of encapsulating by spin coating or screen printing (Patent Document 1), and a method of using a complex sheet where a heat fusible epoxy resin has been coated on a film support (Patent Document 2 and Patent Document 3).

Among these, as a method of encapsulating a device mounting surface of a substrate on which semiconductor devices have been mounted on a wafer level, the following method has been used for mass-production; a film having adhesive layers on both surfaces is bonded to an upper portion of a metal, a silicon wafer or a glass substrate, or an adhesive is coated to the same by spin coating, etc., then, the semiconductor devices are arranged on the substrate, adhered and mounted thereon to form a device mounting surface, and the device mounting surface is then encapsulated by molding a liquid epoxy resin or an epoxy molding compound, etc., under a pressure and a heated condition (Patent Document 4). Also, as a method of encapsulating the device forming surface of a wafer on which semiconductor devices have been formed on a wafer level, a method of encapsulating the device forming surface by molding a liquid epoxy resin or an epoxy molding compound, etc., under a pressure and a heated condition is recently being used for mass-production.

According to the methods as mentioned above, encapsulating can be done at present when a small-diameter wafer of 200 mm (8 inches) or so, or a small-diameter substrate such as a metal, etc., is used without any big problems. However, when a large-diameter substrate on which semiconductor devices having 300 mm (12 inches) or more have been mounted or a large-diameter wafer on which semiconductor devices having the similar size have been formed is to be encapsulated, there is a big problem that the substrate or the wafer warps due to shrinkage stress of the epoxy resin, etc., at the time of encapsulating and curing. In addition, when the device mounting surface of the large-diameter substrate on which semiconductor devices have been mounted is encapsulated on a wafer level, the problem occurs that the semiconductor devices are peeled away from the substrate such as a metal, etc., by shrinkage stress of the epoxy resin, etc., at the time of encapsulating and curing, whereby there is a big problem that they cannot be used for mass-production.

As a method for solving the above-mentioned problems, for collectively encapsulating a device mounting surface of a substrate on which semiconductor devices have been mounted, or a device forming surface of a wafer on which semiconductor devices have been formed, there is a method of using an encapsulant with a base for use in semiconductor encapsulation having a resin-impregnated fibrous base in which a thermosetting resin is impregnated into a fibrous base and the thermosetting resin is semi-cured or cured, and an uncured resin layer composed of an uncured thermosetting resin formed on one surface of the resin-impregnated fibrous base (Patent Document 5).

When such an encapsulant with a base is used for semiconductor encapsulation, the resin-impregnated fibrous base having an extremely little expansion coefficient can suppress shrinkage stress of the uncured resin layer at the time of encapsulating and curing. Therefore, even when a large-diameter wafer or a large-diameter substrate such as a metal, etc., is encapsulated, a device mounting surface of a substrate on which semiconductor devices have been mounted can be collectively encapsulated on a wafer level while suppressing warp of the substrate or peeling of the semiconductor devices away from the substrate. Also, the encapsulant with a base for use in semiconductor encapsulation and has extremely high versatility and will be excellent in encapsulating properties such as heat resistance and humidity resistance after encapsulation.

A semiconductor apparatus using the above encapsulant with a base for use in semiconductor encapsulation has worse appearance than a conventional semiconductor apparatus using a thermosetting epoxy resin etc., for encapsulation because the surface of a base is exposed. Further, there is a problem in that a laser marking property is worse since the surface of the base is exposed.

CITATION LIST

Patent Literature

[Patent Document 1] Japanese Patent Application Publication No. 2002-179885
[Patent Document 2] Japanese Patent Application Publication No. 2009-60146
[Patent Document 3] Japanese Patent Application Publication No. 2007-001266
[Patent Document 3] Japanese Patent Application Publication No. 2004-504723
[Patent Document 3] Japanese Patent Application Publication No. 2012-151451

SUMMARY OF THE INVENTION

The present invention has been made to solve the above-described problems concerning a semiconductor apparatus using an encapsulant with a base for use in semiconductor encapsulation (also simply referred to as an encapsulant with a base, hereinafter), and an object thereof is to provide an encapsulant with a base for use in semiconductor encapsulation that enables a semiconductor apparatus having a good appearance and laser marking property to be manufactured, a semiconductor apparatus and a method for manufacturing a semiconductor apparatus.

To accomplish the above-mentioned object, the present invention provides an encapsulant with a base for use in semiconductor encapsulation, for collectively encapsulating a device mounting surface of a substrate on which semiconductor devices are mounted, or a device forming surface of a wafer on which semiconductor devices are formed, comprising the base, an encapsulating resin layer composed of an uncured or semi-cured thermosetting resin formed on one surface of the base, and a surface resin layer formed on the other surface of the base.

Such an encapsulant having a surface resin layer enables a semiconductor apparatus having a good appearance and laser marking property to be manufactured.

The surface resin layer is preferably formed from any of a curable epoxy resin, a curable silicone resin, a curable epoxy-silicone hybrid resin, a curable epoxy (meth)acrylate, a curable (meth)acrylic resin or a curable polyimide resin, and preferably has a black color.

Such an encapsulant ensures a good appearance and laser marking property.

The surface resin layer can be formed from a liquid resin by a printing method, a spray method, a coating method, or a film thermal compression bonding method and cured by heat or light.

Such a surface resin layer can be readily formed.

Further, the thickness of the surface resin layer is preferably 0.5 μm or more.

Such an encapsulant enables a semiconductor apparatus with an inhibited warp to be manufactured without impairing appearance by exposing the surface of the base at the time of laser marking.

The present invention also provides a semiconductor apparatus obtained by collectively encapsulating a device mounting surface of a substrate on which semiconductor devices are mounted, or a device forming surface of a wafer on which semiconductor devices are formed by the encapsulating resin layer of the above encapsulant of the invention, and dicing the encapsulated substrate or wafer into each individual semiconductor apparatus.

Such a semiconductor apparatus has a good appearance and laser marking property.

In the semiconductor apparatus, the surface resin layer of the encapsulant for use in semiconductor encapsulation may have a marked surface.

Such a semiconductor apparatus has a good appearance with desired marking.

The present invention also provides a method for manufacturing a semiconductor apparatus, comprising the steps of: a coating process of coating a device mounting surface of a substrate on which semiconductor devices are mounted, or a device forming surface of a wafer on which semiconductor devices are formed by the encapsulating resin layer of the above encapsulant of the invention, an encapsulating process of collectively encapsulating the device mounting surface or the device forming surface by heating and curing the encapsulating resin layer, and a dicing process of dicing the encapsulated substrate on which semiconductor devices are mounted or the encapsulated wafer on which semiconductor devices are formed into each individual semiconductor apparatus.

Such a manufacturing method enables a semiconductor apparatus having a good appearance and laser marking property to be manufactured.

The inventive encapsulant with a base for use in semiconductor encapsulation has a base, an encapsulating resin layer composed of an uncured or semi-cured thermosetting resin formed on one surface of the base, and a surface resin layer formed on the other surface of the base, thereby enabling a device mounting surface or a device forming surface to be collectively encapsulated while inhibiting a warp of the substrate and peeling of the semiconductor devices away from the substrate. In addition, the encapsulant enables a semiconductor apparatus having a good appearance and laser marking property to be manufactured.

DETAILED DESCRIPTION OF THE PREFERRED EMBODIMENTS

Embodiments of the present invention are described below but the present invention is not limited to these embodiments.

As mentioned above, the present inventors have diligently studied to solve the problem of a poor appearance and a poor laser marking property of a semiconductor apparatus using an encapsulant with a base for semiconductor encapsulation. The inventors have consequently found that the appearance and the marking property can be improved by using an encapsulant including a base and a surface resin layer formed on its surface exposed the outside, thereby bringing the present invention to completion.

In the following, the encapsulant with a base for use in semiconductor encapsulation, a semiconductor apparatus, and a method for manufacturing a semiconductor apparatus of the present invention are described in detail, but the present invention is not limited thereto.

[Encapsulant with Base for Use in Semiconductor Encapsulation]

Figure 1:
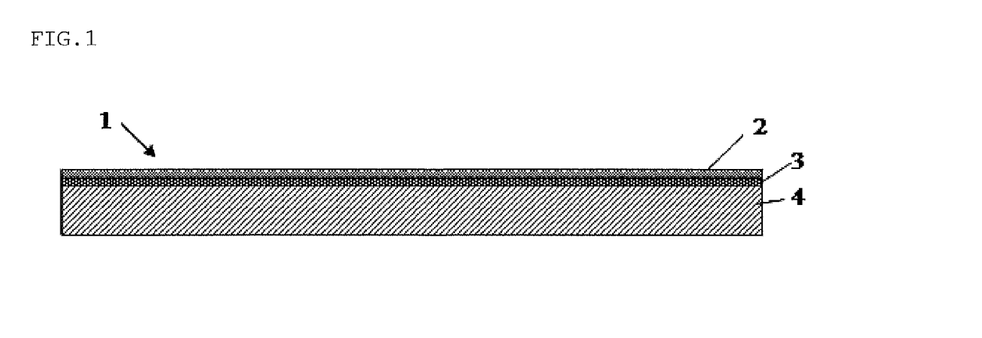
FIG. 1 is a sectional view showing one example of an inventive encapsulant with a base for use in semiconductor encapsulation.

As shown in FIG. 1, the inventive encapsulant 1 with abase for use in semiconductor encapsulation mainly includes a substrate 3, an encapsulating resin layer 4 that is composed of an uncured or semi-cured thermosetting resin and formed on one surface of the substrate 3, and a surface resin layer 2 formed on the other surface of the substrate 3.

(Surface Resin Layer)

The surface resin layer 2 constituting the inventive encapsulant with a base can be formed from any of a curable epoxy resin, a curable silicone resin, a curable epoxy-silicone hybrid resin, a curable epoxy (meth)acrylate, a curable (meth)acrylic resin and a curable polyimide resin, but the invention is not limited thereto.

<Epoxy Resin>

The epoxy resin to be used for the surface resin layer 2 in the present invention is not particularly limited, and may be mentioned, for example, a biphenol type epoxy resin such as a bisphenol A type epoxy resin, a bisphenol F type epoxy resin, a 3,3',5,5'-tetramethyl-4,4'-biphenol type epoxy resin and a 4,4'-biphenol type epoxy resin; an epoxy resin in which an aromatic ring of a phenol novolac type epoxy resin, a cresol novolac type epoxy resin, a bisphenol A novolac type epoxy resin, a naphthalenediol type epoxy resin, a trisphenylolmethane type epoxy resin, a tetrakisphenylolethane type epoxy resin or a phenoldicyclopentadiene novolac type epoxy resin has been hydrogenated; and a conventionally known epoxy resin which is a liquid state or a solid state at room temperature such as an alicyclic epoxy resin, etc. Also, depending on necessity, an epoxy resin(s) other than the above may be used in combination with a certain amount depending on the purposes.

The surface resin layer 2 composed of an epoxy resin may contain a curing agent of an epoxy resin. As such a curing agent, a phenol novolac resin, various kinds of amine derivatives, and a material in which a part of an acid anhydride or an acid anhydride group is ring-opened to form a carboxylic acid, etc., may be used. Above all, a phenol novolac resin is desired to ensure reliability of the semiconductor apparatus manufactured by using an inventive encapsulant with a base. It is particularly preferred that the above-mentioned epoxy resin and the phenol novolac resin are so mixed that the ratio of the epoxy group and the phenolic hydroxyl group becomes 1:0.8 to 1.3.

Further, to promote the reaction of the above-mentioned epoxy resin and the curing agent, imidazole derivatives, phosphine derivatives, amine derivatives, a metal compound such as an organic aluminum compound, etc., may be used as a reaction promoter (or a catalyst).

Into the surface resin layer 2 composed of an epoxy resin may be further formulated various kinds of additives depending on necessity. For example, for the purpose of improving the properties of the resin, various kinds of thermoplastic resins, thermoplastic elastomers, organic synthetic rubbers, stress lowering agents such as a silicone type, etc., waxes, and additives such as a halogen-trapping agent, etc., may be optionally added and formulated depending on the purposes.

<Silicone Resin>

The silicone resin to be used in the surface resin layer 2 of the present invention is not particularly limited, and may be used a thermosetting, UV curable silicone resin, etc. In particular, the resin layer comprising a silicone resin desirably contains an addition curable silicone resin composition. The addition curable silicone resin composition particularly preferred is a composition comprising (A) an organosilicon compound having a nonconjugated double bond (for example, an alkenyl group-containing diorganopolysiloxane), (B) an organohydrogen polysiloxane, and (C) a platinum type catalyst as essential components. In the following, these Components (A) to (C) are explained.

The above-mentioned (A) organosilicon compound having a nonconjugated double bond may be exemplified by an organopolysiloxane such as a linear diorganopolysiloxane in which both ends of the molecular chain have been encapsulated by aliphatic unsaturated group-containing triorganosiloxy groups represented by the formula (1):

wherein $R^1$ represents a monovalent hydrocarbon group containing a nonconjugated double bond, $R^2$ to $R^7$ each represent a monovalent hydrocarbon group which may be the same or different from each other, and repeating units "a" and "b" are each an integer satisfying $0 \leq a \leq 500$, $0 \leq b \leq 250$, and $0 \leq a+b \leq 500$, and the like.

In the above-mentioned formula (1), $R^1$ represents a monovalent hydrocarbon group containing a nonconjugated double bond, and preferably a monovalent hydrocarbon group containing a nonconjugated double bond and having an aliphatic unsaturated bond represented by an alkenyl group having 2 to 8 carbon atoms, particularly preferably 2 to 6 carbon atoms.

In the above-mentioned formula (1), $R^2$ to $R^7$ each represent a monovalent hydrocarbon group which may be the same or different from each other, preferably mentioned an alkyl group, an alkenyl group, an aryl group, an aralkyl group, etc., each having 1 to 20 carbon atoms, particularly preferably 1 to 10 carbon atoms. Also, among these, $R^4$ to $R^7$ more preferably each represent a monovalent hydrocarbon group except for an aliphatic unsaturated bond, particularly preferably an alkyl group, an aryl group, aralkyl group, etc., which do not have an aliphatic unsaturated bond such as an alkenyl group, etc. Moreover, among these, $R^6$ and $R^7$ each preferably an aromatic monovalent hydrocarbon group, particularly preferably an aryl group having 6 to 12 carbon atoms such as a phenyl group and a tollyl group, etc.

In the above-mentioned formula (1), repeating units "a" and "b" are each an integer satisfying $0 \leq a \leq 500$, $0 \leq b \leq 250$, and $0 \leq a+b \leq 500$, "a" is preferably $10 \leq a \leq 500$, "b" is preferably $0 \leq b \leq 150$, and a+b preferably satisfy $10 \leq a+b \leq 500$.

The organopolysiloxane represented by the above-mentioned formula (1) can be obtained, for example, by an alkali equilibration reaction of a cyclic diorganopolysiloxane such as cyclic diphenylpolysiloxane, cyclic methylphenylpolysiloxane, etc., with a disiloxane such as diphenyltetravinyldisiloxane, divinyltetraphenyldisiloxane, etc., which constitute terminal groups. In this case, in an equilibration reaction by an alkali catalyst (particularly a strong alkali such as KOH, etc.), polymerization proceeds with an irreversible reaction with a small amount of the catalyst, so that a ring-opening polymerization alone proceeds quantitatively, and a terminal encapsulating ratio is high, whereby a silanol group and a chlorine content are generally not contained.

The organopolysiloxane represented by the above-mentioned formula (1) may be exemplified by the following, wherein repeating units "k" and "m" are each an integer satisfying 0≤k≤500, 0≤m≤250, and 0≤k+m≤500, preferably an integer satisfying 5≤k+m≤250, and 0≤m/(k+m)≤0.5.

As Component (A), in addition to the organopolysiloxane having a linear structure represented by the above-mentioned formula (1), an organopolysiloxane having a three-dimensional network structure containing a tri-functional siloxane unit, a tetra-functional siloxane unit, etc., may be used in combination depending on necessity. The (A) organosilicon compound having a nonconjugated double bond may be used a single kind alone or may be used two or more kinds in admixture.

An amount of the group (for example, a monovalent hydrocarbon group having a double bond bonded to the Si atom such as an alkenyl group, etc.) having a nonconjugated double bond in (A) the organosilicon compound having a nonconjugated double bond is preferably 0.1 to 20 mol % based on the total monovalent hydrocarbon group (total monovalent hydrocarbon group bonded to the Si atom), more preferably 0.2 to 10 mol %, particularly preferably 0.1 to 5 mol %. If an amount of the group having a nonconjugated double bond is 0.1 mol % or more, a good cured product can be obtained when it is cured, while if it is 20 mol % or less, mechanical property of the cured product is good so that the above range is preferred.

Also, (A) the organosilicon compound having a nonconjugated double bond preferably has an aromatic monovalent hydrocarbon group (aromatic monovalent hydrocarbon group bonded to the Si atom), and a content of the aromatic monovalent hydrocarbon group is preferably 0 to 95 mol % based on the total monovalent hydrocarbon group (total monovalent hydrocarbon group bonded to the Si atom), more preferably 10 to 90 mol %, particularly preferably 20 to 80 mol %. The aromatic monovalent hydrocarbon group has merits that mechanical properties of the cured product are good and the material can be easily manufactured when it is contained in the resin with a suitable amount.

As the above-mentioned Component (B), an organohydrogenpolysiloxane having two or more hydrogen atoms bonded to the silicon atom (SiH group) in one molecule is preferred. If an organohydrogenpolysiloxane having two or more hydrogen atoms bonded to the silicon atom (SiH group) in one molecule is used, it acts as a cross-linking agent, the SiH group in Component (B) and the vinyl group, and other nonconjugated double bond-containing group such as an alkenyl group, etc., in Component (A) are subjected to addition reaction to form a cured product.

Also, the organohydrogen polysiloxane (B) preferably has an aromatic monovalent hydrocarbon group. Thus, if the organohydrogen polysiloxane (B) having an aromatic monovalent hydrocarbon group is used, compatibility with the above-mentioned Component (A) can be heightened. The organohydrogenpolysiloxane (B) may be used a single kind alone or may be used two or more kinds in admixture, and, for example, an organohydrogen polysiloxane (B) having an aromatic hydrocarbon group may be contained as a part or whole of Component (B).

Although not restricted, examples of the organohydrogenpolysiloxanes (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glysidoxypropyl-1,3,5,7-tetramethylcyclotetrasiloxane, 1,5-glysidoxypropyl-1,3,5,7-tetramethylcyclotetrasiloxane, 1-glysidoxypropyl-5-trimethoxysilylethyl-1,3,5,7-tetramethylcyclotetrasiloxane, methylhydrogenpolysiloxane having both molecular terminals capped with trimethylsiloxy groups, a dimethylsiloxane/methylhydrogensiloxane copolymer having both molecular terminals capped with trimethylsiloxy groups, dimethylpolysiloxane having both molecular terminals capped with dimethylhydrogensiloxy groups, a dimethylsiloxane/methylhydrogensiloxane copolymer having both molecular terminals capped with dimethylhydrogensiloxy groups, a methylhydrogensiloxane/diphenylsiloxane copolymer having both molecular terminals capped with trimethylsiloxy groups, a methylhydrogensiloxane/diphenylsiloxane/dimethylsiloxane copolymer having both molecular terminals capped with trimethylsiloxy groups, a trimethoxysilane polymer, a copolymer of a $(CH_3)_2HSiO_{1/2}$ unit and a $SiO_{4/2}$ unit, and a copolymer of a $(CH_3)_2HSiO_{1/2}$ unit, a $SiO_{4/2}$ unit, and a $(C_6H_5)SiO_{3/2}$ unit.

In addition, an organohydrogenpolysiloxane obtained by using the unit represented by the following structures may be also used.

Further, the organohydrogen polysiloxane (B) may be mentioned the following materials.

-continued

The molecular structure of the organohydrogen polysiloxane (B) may be any of a linear, a cyclic, a branched or a three-dimensional network structure, and a number of the silicon atoms in one molecule (or a polymerization degree in case of a polymer) is preferably 2 or more, more preferably 3 to 500, particularly preferably used are 4 to 300 or so.

A formulation amount of the organohydrogen polysiloxane (B) is preferably such an amount that a number of the hydrogen atom (s) (SiH group) bonded to the silicon atom in Component (B) becomes 0.7 to 3.0 per one group having the nonconjugated double bond such as an alkenyl group, etc., in Component (A).

As the above-mentioned Component (C), a platinum type catalyst is used. The platinum type catalyst (C) may be mentioned, for example, chloroplatinic acid, alcohol-modified chloroplatinic acid, a platinum complex having a chelate structure, etc. These may be used a single kind alone or may be used two or more kinds in admixture.

A formulation amount of the platinum type catalyst (C) is an effective amount for curing, and may be the so-called catalytic amount. It is generally preferably 0.1 to 500 ppm in terms of a mass of the platinum group metal based on the total mass of 100 parts by mass of the above-mentioned Component (A) and Component (B), in particular, it is preferred in the range of 0.5 to 100 ppm.

<Epoxy-Silicone Hybrid Resin>

The curable epoxy-silicone hybrid resin to be used in the surface resin layer 2 is not particularly limited, and the above-mentioned epoxy resin and the above-mentioned silicone resin may be mentioned.

<Epoxy (Meth)Acrylate>

The epoxy (meth)acrylate to be used as the surface resin layer 2 means, for example, an acrylate obtained by reacting the conventionally known aromatic epoxy resin, alicyclic epoxy resin, aliphatic epoxy resin, etc., with (meth)acrylic acid. These epoxy acrylates are not particularly limited, and particularly preferred is an acrylate of an aromatic epoxy resin, or a (meth)acrylate obtained by reacting a polyglycidyl ether of a polyvalent phenol having at least one aromatic nucleus or its alkylene oxide adduct with (meth) acrylic acid. There may be mentioned, for example, a (meth)acrylate obtained by reacting a glycidyl ether which is obtained by the reaction of bisphenol A, or its alkylene oxide adduct with epichlorohydrin, and (meth)acrylic acid, a (meth)acrylate obtained by reacting an epoxy novolac resin and (meth)acrylic acid, and the like.

<(Meth)Acrylic Resin>

The (meth)acrylic resin to be used as the surface resin layer 2 is not particularly limited, and may include (meth) acrylic acid and/or a polymer and a copolymer of its various kinds of derivatives. The (meth)acrylic acid derivatives may be mentioned alkyl (meth)acrylate such as methyl (meth) acrylate, ethyl (meth)acrylate, butyl (meth)acrylate, isobutyl (meth)acrylate, 2-ethylhexyl (meth)acrylate, lauryl (meth) acrylate, etc.; hydroxylalkyl (meth)acrylate such as hydroxylethyl (meth)acrylate, hydroxylpropyl (meth)acrylate, etc.; a (meth)acrylate containing an aromatic group such as benzyl (meth)acrylate, etc.; a (meth)acrylamide such as dimethyl(meth)acrylamide, etc.; a (meth)acrylate containing an imide group such as imidoacrylate TO-1492 (available from Toagosei Co., Ltd.), etc.; a (meth)acrylate containing an epoxy group such as glycidyl (meth)acrylate, etc. Also, the above-mentioned copolymer includes a copolymer of the above-mentioned (meth)acrylic acid and/or various kinds of derivatives thereof with acrylonitrile, styrene, butadiene or allyl derivatives, etc.

<Polyimide Resin>

The polyimide resin to be used in the surface resin layer 2 is not particularly limited, and suitably usable examples may be mentioned a polyimide resin which can be obtained by synthesizing a polyamic acid from an acid dianhydride and a diamine compound, and then, dehydrating the resulting acid under heating.

The acid dianhydride to be used for synthesis of the above-mentioned polyamic acid may be mentioned, for example, 3,3'-, or 4,4'-diphenylsulfone tetracarboxylic acid dianhydride, 3,3'-, or 4,4'-biphenyltetracarboxylic acid dianhydride, 2,3'-, or 3,4'-biphenyltetracarboxylic acid dianhydride, 5-(2,5-dioxotetrahydro-3-furanyl)-3-methyl-3-cyclohexene-1,2-dicarboxylic acid anhydride, 4-(2,5-dioxotetrahydrofuran-3-yl)-1,2,3,4-tetrahydro-naphthalene-1,2-dicarboxylic acid anhydride, 1,2,3,4-butane tetracarboxylic acid dianhydride, 3,3'-, or 4,4'-benzophenone tetracarboxylic acid dianhydride, 4,4'-hexafluoropropylidene bisphthalic acid dianhydride, 1,3-tetramethyl disiloxane bisphthalic acid dianhydride, and 4,4'-oxydiphthalic acid dianhydride.

The diamine compound to be used for synthesis of the above-mentioned polyamic acid may be mentioned, for example, a diamine having a phenol group such as 3,3'-diamino-4,4'-dihydroxybiphenyl, 2,2'-diamino-4,4'-dihydroxybiphenyl, 2,2-bis(4-amino-3-hydroxyphenyl)propane, 2,2-bis(3-amino-4-hydroxyphenyl)propane, 9,9-bis(3-amino-4-hydroxyphenyl)fluorine, 2,2'-methylenebis[6-(4-amino-3,5-dimethylbenzyl)-4-methyl]phenol, 3,3'-diamino-4,4'-dihydroxydiphenyl ether, 2,2-bis(3-amino-4-hydroxyphenyl)hexafluoropropane, etc.; 4,4'-diaminobenzanilide, 4,4'-diaminodiphenyl ether, 3,4'-diaminodiphenyl ether, 4,4'-diaminodiphenylsulfone, 3,3'-dimethyl-4,4'-diaminobiphenyl, 4,4'-(p-phenylenediisopropylidene)dianiline, 4,4'-(m-phenylenediisopropylidene)dianiline, 1,3-bis(4-aminophenoxy)benzene, 1,4-bis(4-aminophenoxy)benzene, 1,3-bis(3-aminophenoxy)benzene, 2,2-bis[4-(4-aminophenoxyl)phenyl]propane, 2,2-bis[4-(4-aminophenoxyl)phenyl] hexafluoropropane, bis[4-(4-aminophenoxyl)phenyl] sulfone, bis[4-(3-aminophenoxyl)phenyl]sulfone, 4,4'-bis(4-aminophenoxy)biphenyl, 9,9-bis(4-aminophenyl)fluorine, etc.

<Inorganic Filler>

Into the surface resin layer 2, an inorganic filler may be formulated. The inorganic filler to be formulated may be mentioned silica's such as aerosol silica (fumed silica), precipitated silica, fused silica, crystalline silica, etc.; alumina, silicon nitride, aluminum nitride, aluminosilicate, boron nitride, glass fiber, antimony trioxide, etc. An average particle diameter or a shape of these inorganic fillers is not particularly limited.

As the above-mentioned inorganic filler, those which are previously surface treated by a coupling agent such as a silane coupling agent, a titanate coupling agent, etc., may be formulated.

Such a coupling agent may be preferably used, for example, an epoxy functional alkoxysilane such as γ-glycidoxypropyltrimethoxysilane, γ-glycidoxypropylmethyl-diethoxysilane, β-(3,4-epoxycyclohexyl)ethyltrimethoxysilane, etc.; an amino functional alkoxysilane such as N-β-(aminoethyl)-γ-aminopropyltrimethoxysilane, γ-aminopropyltriethoxysilane, N-phenyl-γ-aminopropyltrimethoxysilane, etc.; and a mercapto functional alkoxysilane such as γ-mercaptopropyltrimethoxysilane, etc. Incidentally, a formulation amount of the coupling agent to be used for the surface treatment and a method of the surface treatment are not particularly limited.

<Pigment>

In the surface resin layer 2, a pigment to make the color of the layer black may be contained. The pigment to be used herein may be mentioned, for example, carbon black, furnace black, acetylene black, etc., which have conventionally been used for encapsulating the resin composition, but the invention is not limited thereby.

By making the color of the surface resin layer 2 black as mentioned above, the semiconductor apparatus manufactured by using an inventive encapsulant with a base can obtain the same good appearance and a laser marking property as in those of the conventional semiconductor apparatus encapsulated by an epoxy resin, etc.

The thickness of the surface resin layer 2 is preferably 0.5 μm or more, more preferably 0.5 μm to 500 μm. If it is 0.5 μm or more, clear printing can be done at the time of laser marking, as well as exposure of the base surface or impairment of appearance can be avoided. In addition, the surface resin layer 2 can be formed easily. If it is 500 μm or less, occurrence of warp of the semiconductor apparatus can be certainly suppressed.

(Base)

The material of a base 3, which is included in an inventive encapsulant with a base for use in semiconductor encapsulation, is not particularly limited, and an inorganic substrate, a metal substrate or an organic resin substrate may be used as the base depending on a semiconductor device mounting substrate or a semiconductor device forming wafer being encapsulated. An organic resin substrate containing fiber may also be used.

Typical examples of the inorganic substrate include a ceramics substrate, a glass substrate, and a silicon wafer. Typical examples of the metal substrate include a copper or aluminum substrate whose surface has been subjected to an insulation treatment. Examples of the organic resin substrate include a resin-impregnated fibrous base in which a thermosetting resin or a filler, etc., has been impregnated into a fibrous base, and a resin-impregnated fibrous base in which a thermosetting resin has been semi-cured or cured, and a resin substrate in which a thermosetting resin has been molded into a substrate shape. Typical examples of the substrate include a BT (bismaleimide triazine) resin substrate, a glass epoxy substrate, and a FRP (fiber reinforced plastic) substrate.

A material which can be used as the above-mentioned fibrous base may be exemplified by, for example, an inorganic fiber such as carbon fiber, glass fiber, quartz glass fiber, metal fiber, etc.; an organic fiber such as aromatic polyamide fiber, polyimide fiber, polyamideimide fiber, etc.; and further silicon carbide fiber, titanium carbide fiber, boron fiber, alumina fiber, etc., and any materials may be used depending on the product properties. The most preferred fibrous base may be exemplified by glass fiber, quartz fiber, carbon fiber, etc. Above all, glass fiber or quartz glass fiber having high insulation property is preferred as the fibrous base.

The above-mentioned thermosetting resin is not particularly limited, and there may be mentioned a BT resin, an epoxy resin, etc., and an epoxy resin, a silicone resin, a hybrid resin comprising an epoxy resin and a silicone resin, which are used for encapsulating the semiconductor devices in general and exemplified below, and further a cyanate ester resin, etc.

When an inventive encapsulant with a base is manufactured with a resin-impregnated fibrous base using a thermosetting epoxy resin as the thermosetting resin to be impregnated into the above fibrous base, or the resin-impregnated fibrous base after the epoxy resin is semi-cured, a preferable thermosetting resin used for forming the encapsulating layer on one surface of the base is also an epoxy resin. Thus, when the thermosetting resin impregnated into the base and the thermosetting resin of the encapsulating resin layer are identical, the resins can be simultaneously cured when a device mounting surface of a semiconductor device mounting substrate is collectively encapsulated, whereby more firm encapsulating function can be preferably accomplished.

The thickness of the substrate 3 is preferably 20 μm to 1 mm in either of the cases where the thermosetting resin impregnated into the fibrous base is semi-cured or cured, more preferably a material having 30 μm to 500 μm is desired. If it is 20 μm or more, it can suppress to easily deform due to too thin, while if it is 1 mm or less, it can also suppress the semiconductor apparatus itself to be thick so that the above range is preferred.

The substrate 3 is important to reduce the warp of a semiconductor device mounting substrate after collectively encapsulating the device mounting surface, and to reinforce the substrate on which one or more semiconductor devices have been arranged and bonded. Thus, the base is desirably hard and rigid.

(Encapsulating Resin Layer)

The encapsulating resin layer 4, which is included in the inventive encapsulant with a base for use in semiconductor encapsulation, is composed of an uncured or semi-cured thermosetting resin formed on one surface of the substrate 3. The encapsulating resin layer 4 becomes a resin layer for encapsulation.

The thickness of the encapsulating resin layer 4 is preferably 20 μm or more and 2,000 μm or less. The encapsulating resin layer having a thickness of 20 μm or more can sufficiently encapsulate a device mounting surface of a semiconductor device mounting substrate or a device forming surface of a semiconductor device forming wafer, and prevent a failure in filling due to thinness. The encapsulating resin layer having a thickness of 2000 μm or less can prevent an excessive increase in the thickness of a semiconductor apparatus after encapsulation.

The encapsulating resin layer 4 is not particularly limited, and it is preferably a thermosetting resin layer composed of a liquid epoxy resin, a solid epoxy resin, a silicone resin, a hybrid resin of an epoxy resin and a silicone resin, or a cyanate ester resin, each of which is generally used for encapsulating semiconductor devices. In particular, the above-mentioned thermosetting resin layer preferably contains at least one of an epoxy resin, a silicone resin, an epoxy-silicone hybrid resin, and a cyanate ester resin, each of which solidifies at temperatures lower than 50° C. and melts at temperatures ranging from 50° C. to 150° C.

<Epoxy Resin>

The epoxy resin to be used in the encapsulating resin layer 4 is not particularly limited, and the same epoxy resin to be used in the above-mentioned surface resin layer 2 may be used.

The encapsulating resin layer 4 comprising the above-mentioned epoxy resin becomes a resin layer for encapsulating the semiconductor device so that it is preferred that an amount of a halogen ion such as chlorine, etc., or an alkali ion such as sodium, etc., is reduced as little as possible. It is generally desired that an amount of either of the ions is 10 ppm or less by the extraction that 10 g of the sample is added to 50 ml of ion exchanged water, the mixture is encapsulated and allowed to stand in an oven at 120° C. for 20 hours and then, extracted at 120° C. under heating.

<Silicone Resin>

The silicone resin to be used in the encapsulating resin layer 4 is not particularly limited, and the same silicone resin to be used in the above-mentioned surface resin layer 2 may be used.

The encapsulating resin layer 4 comprising the above-mentioned silicone resin becomes a resin layer for encapsulating the semiconductor device so that it is preferred that an amount of a halogen ion such as chlorine, etc., or an alkali ion such as sodium, etc., is reduced as little as possible. It is generally desired that an amount of either of the ions is 10 ppm or less by the extraction at 120° C.

<Epoxy-Silicone Hybrid Resin>

The curable epoxy-silicone hybrid resin to be used in the encapsulating resin layer 4 is not particularly limited, and may be mentioned the above-mentioned epoxy resin and the above-mentioned silicone resin.

The encapsulating resin layer 4 comprising the above-mentioned hybrid resin becomes a resin layer for encapsulating the semiconductor device so that it is preferred that an amount of a halogen ion such as chlorine, etc., or an alkali ion such as sodium, etc., is reduced as little as possible. It is generally desired that an amount of either of the ions is 10 ppm or less by the extraction at 120° C.

<Cyanate Ester Resin>

The cyanate ester resin to be used as the encapsulating resin layer 4 is not particularly limited, and may be mentioned, for example, a resin composition in which a cyanate ester compound, a phenol compound, and/or dihydroxynaphthalene is/are formulated.

<<Cyanate Ester Compound>>

The component to be used as the above-mentioned cyanate ester compound or an oligomer thereof is a material represented by the following formula (2), (2)

wherein $R^1$ and $R^2$ each represent a hydrogen atom or an alkyl group having 1 to 4 carbon atoms, $R^3$ represents

$R^4$ represents a hydrogen atom or a methyl group; and "n" represents an integer of 0 to 30.

Here, the cyanate ester compound is a compound having two or more cyanate groups in one molecule, and specifically mentioned a cyanic acid ester of a polycyclic aromatic divalent phenol including, for example, bis(3,5-dimethyl-4-cyanatephenyl)methane, bis(4-cyanatephenyl)methane, bis(3-methyl-4-cyanatephenyl)methane, bis(3-ethyl-4-cyanatephenyl)methane, bis(4-cyanatephenyl)-1,1-ethane, bis(4-cyanatephenyl)-2,2-propane, di(4-cyanatephenyl) ether, di(4-cyanatephenyl)thio ether; a polycyanic acid ester of a polyvalent phenol including, for example, a phenol novolac type cyanate ester, a cresol novolac type cyanate ester, a phenylaralkyl type cyanate ester, a biphenylaralkyl type cyanate ester, a naphthalenearalkyl type cyanate ester, etc. The above-mentioned cyanate ester compound can be obtained by reacting a phenol and cyanogen chloride under basic conditions. The above-mentioned cyanate ester compound may be optionally selected from the materials having wide characteristics from a solid state having a softening point of 106° C. to a liquid state at normal temperature depending on the purposes.

That having a small cyanate equivalent, i.e., a molecular weight between functional groups is small, shows a small hardening shrinkage, so that a cured product having low thermal expansion and high Tg can be obtained. When the material has a large cyanate equivalent, Tg of the cured product is slightly lowered, but a triazine cross-linking distance becomes flexible so that reduction of elasticity, elevation of toughness and reduction of water absorbability can be expected. Chlorine bonded to or remained in the cyanate ester compound is suitably 50 ppm or less, more preferably 20 ppm or less. If it is 50 ppm or less, there is less possibility of causing corrosion of an oxidated Cu frame, Cu wire or Ag plating by chlorine or a chlorine ion liberated by thermal decomposition during the storage at high temperature for long period of time, or causing exfoliation or electric failure. In addition, insulating property of the resin is also good.

<<Phenol Compound>>

The phenol compound to be used in the present invention is not particularly limited, and examples thereof may be mentioned the compound represented by the following formula (3).

(3)

wherein $R^5$ and $R^6$ each represent a hydrogen atom or an alkyl group having 1 to 4 carbon atoms; $R^7$ represents where $R^4$ represents a hydrogen atom or a methyl group; and a repeating unit "m" represents an integer of 0 to 30.

Here, the phenol compound may be mentioned a phenol resin, a bisphenol F type resin, a bisphenol A type resin, a phenol novolac resin, a phenolaralkyl type resin, a biphenylaralkyl type resin, and a naphthalenearalkyl type resin each having at least two phenolic hydroxyl groups in one molecule, and among these, a single kind or two or more kinds may be used in admixture.

<<Curing Catalyst>>

The curing catalyst of the cyanate ester compound may be generally mentioned a metal salt; a metal complex; and a phenolic hydroxyl group or a primary amine each having an active hydrogen, etc., and a phenol compound or a dihydronaphthalene compound is suitably used.

The phenol compound having a small phenolic hydroxyl equivalent, for example, a hydroxyl equivalent of 120 or less, has high reactivity with the cyanate group, and the curing reaction proceeds at a low temperature of 120° C. or lower. In this case, it is preferable to reduce the molar ratio of the hydroxyl group to the cyanate group.

Preferred range thereof is 0.05 to 0.11 mol per 1 mol of the cyanate group. In this case, a cured product causing small hardening shrinkage, and having a low thermal expansion and high Tg can be obtained.

On the other hand, that having a large phenolhydroxyl equivalent, for example, a hydroxyl equivalent of 175 or more, shows that the reaction with the cyanate group is suppressed, and gives a composition having good preservability and good flowability. Suitable range thereof is 0.1 to 0.4 mol per 1 mol of the cyanate group. In this case, while Tg of the cured product is slightly lowered, but the product having a low water absorption can be obtained. These phenol compounds may be used two or more kinds in combination to obtain desired characteristics of the cured product and curability of the same.

The dihydroxynaphthalene compound is represented by the following formula (4).

(4)

Here, the dihydroxynaphthalene may be mentioned 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 2,6-dihydroxynaphthalene, 2,7-dihydroxynaphthalene, etc. 1,2-Dihydroxynaphthalene, 1,3-dihydroxynaphthalene, and 1,6-dihydroxynaphthalene each of which has a melting point of 130° C. have extremely high reactivity, and promote cyclization reaction of the cyanate group with a minute amount. 1,5-Dihydroxynaphthalene and 2,6-dihydroxynaphthalene each of which has a melting point of 200° C. or higher relatively suppress the reaction. When these dihydroxynaphthalenes are used singly, a molecular weight between the functional groups is small, and the structure is rigid so that hardening shrinkage is small, whereby the cured product having high Tg can be obtained.

Also, curability can be adjusted by using a phenol compound having a large hydroxyl equivalent which has two or more hydroxyl groups in one molecule in combination.

A halogen element or an alkali metal, etc., in the above-mentioned phenol compound and the dihydroxynaphthalene is desirably 10 ppm or less, in particular, 5 ppm or less by the extraction at 120° C. under 2 atm.

<<Inorganic Filler>>

Into the encapsulating resin layer 4 may be formulated an inorganic filler. The inorganic filler to be formulated may be mentioned, for example, silica's such as fused silica, crystalline silica, etc.; alumina, silicon nitride, aluminum nitride, alumino silicate, boron nitride, glass fiber, antimony trioxide, etc. An average particle diameter or a shape of these inorganic fillers is not particularly limited.

In particular, as the above-mentioned inorganic filler to be added to the encapsulating resin layer 4 comprising the epoxy resin, a material which has previously been surface treated by a coupling agent such as a silane coupling agent, a titanate coupling agent, etc., may be formulated to strengthen the bonding strength between the epoxy resin and the inorganic filler.

Such a coupling agent may be preferably used, for example, an epoxy functional alkoxysilane such as γ-glycidoxypropyltrimethoxysilane, γ-glycidoxypropylmethyl-diethoxysilane, β-(3,4-epoxy cyclohexyl)ethyltrimethoxysilane, etc.; an amino functional alkoxysilane such as N-β-(aminoethyl)-γ-aminopropyltrimethoxysilane, γ-aminopropyltriethoxysilane, N-phenyl-γ-aminopropyltrimethoxysilane, etc.; a mercapto functional alkoxysilane such as γ-mercaptopropyltrimethoxysilane, etc. Incidentally, a formulation amount of the coupling agent to be used for the surface treatment and a method of the surface treatment are not particularly limited.

A formulation amount of the above-mentioned inorganic filler is preferably 100 to 1300 parts by mass, particularly preferably 200 to 1000 parts by mass based on the total mass of 100 parts by mass of the resins in the epoxy resin composition or the silicone resin composition. If it is 100 parts by mass or more, sufficient strength can be obtained, while if it is 1300 parts by mass or less, failure in filling property due to lowering in fluidity can be suppressed, and as a result, the semiconductor devices mounted on the substrate can be well encapsulated. Incidentally, the inorganic filler is contained in the whole composition constituting the encapsulating resin layer 4 in the range of 50 to 95% by mass, particularly preferably 60 to 90% by mass.
[Manufacturing Method of Encapsulant with Base for Use in Semiconductor Encapsulation]

As shown in FIG. 1, the inventive encapsulant with a base for use in semiconductor encapsulation can be manufactured by forming the encapsulating resin layer 4 composed of an uncured or semi-cured thermosetting resin on one surface of the substrate 3, and the surface resin layer 2 on the other surface of the substrate 3.

The surface resin layer 2 can be formed by forming a resin layer on a base by use of a printing method, a spray method, a coating method, a film thermal compression bonding method, or a press molding method, which has been used for an epoxy curable resin or a silicone curable resin, and then curing the resin layer by heat or light.

The encapsulating resin layer 4 can be formed by various kinds of methods: a method in which an uncured thermosetting resin in a sheet state or a film state is stacked on a surface of the substrate 3 on which the surface resin layer 2 is not formed, and formed into the encapsulating resin layer by a vacuum laminate, high temperature vacuum press or a heat roller, and the like; a method in which a thermosetting resin, such as a liquid epoxy resin and a silicone resin, is coated under reduced pressure or under vacuum by printing or dispensing, etc., and then heated; and a method in which an uncured thermosetting resin is press molded, for example.
[Semiconductor Device Mounting Substrate and Semiconductor Device Forming Wafer]

The semiconductor device mounting substrate to be encapsulated by an inventive encapsulant with a base may be, but not particularly limited to, an organic substrate, an inorganic substrate or a metal substrate on which semiconductor devices have been mounted on its device mounting surface. The semiconductor device mounting substrate may include a semiconductor device array in which semiconductor devices have been mounted and arrayed. The semiconductor device forming wafer is a wafer on which semiconductor devices have been formed. Examples of the wafer include a silicon (Si) wafer, and a SiC wafer.
[Semiconductor Device Mounting Substrate after Encapsulating]

Figure 2:
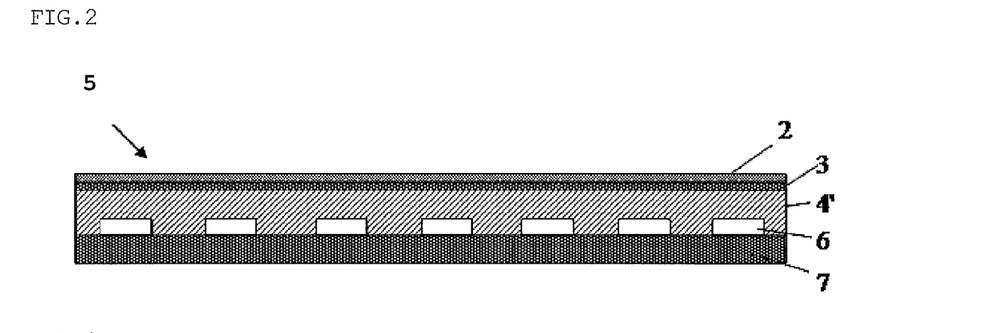
FIG. 2 is a drawing of an example of an encapsulated semiconductor device mounting substrate obtained by collectively encapsulating a semiconductor device mounting substrate by an inventive encapsulant with a base for use in semiconductor encapsulation.

FIG. 2 shows a sectional view of an example of a semiconductor device mounting substrate encapsulated by an inventive encapsulant with a base. As shown in FIG. 2, in the semiconductor device mounting substrate 5 after encapsulating, the device mounting surface of the substrate 7 on which semiconductor devices 6 have been mounted is covered with the encapsulating resin layer 4 of the encapsulant 1 with a base shown in FIG. 1, and the encapsulating resin layer 4 is heated and cured to form a cured encapsulating resin layer 4'.
[Semiconductor Apparatus]

Figure 3:
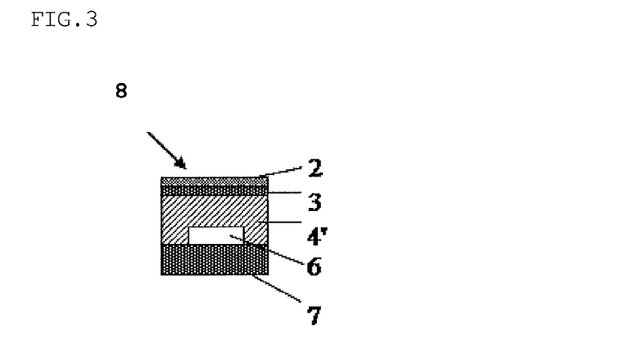
FIG. 3 illustrates one example of a semiconductor apparatus manufactured by using an inventive encapsulant with a base for use in semiconductor encapsulation.

An example of the semiconductor apparatus of the present invention is shown in FIG. 3. As shown in FIG. 3, the semiconductor apparatus 8 is obtained by collectively encapsulating a device mounting surface of a semiconductor device mounting substrate or a device forming surface of a semiconductor device forming wafer by the encapsulating resin layer 4' to form an encapsulated substrate or an encapsulated wafer, and dicing the encapsulated substrate or wafer into each individual semiconductor apparatus.

In such a semiconductor apparatus, since the surface of the base is not exposed to the outside but covered by the surface resin layer 2, the appearance of the semiconductor apparatus is as good as a conventional semiconductor apparatus encapsulated only an encapsulating resin without a base. In addition, it is not necessary to mark the base directly and marking can be done onto the surface resin layer 2, whereby the marking property can be improved. Marking can be carried out by, for example, a laser.
[Manufacturing Method of Semiconductor Apparatus]
(Coating Process)

First, the device mounting surface of the semiconductor device mounting substrate, or the device forming surface of the semiconductor device forming wafer is coated by the encapsulating resin layer 4 of the above-described encapsulant 1 with a base of the present invention as shown in FIG. 1.
(Encapsulating Process)

Next, as shown in FIG. 2, the encapsulating resin layer 4 is cured by heating to form the cured encapsulating resin layer 4' and to collectively encapsulate the device mounting surface or the device forming surface.
(Dicing Process)

The semiconductor device mounting substrate or the semiconductor device forming wafer after encapsulating is then diced into individual semiconductor apparatuses as shown in FIG. 3.

EXAMPLES

The present invention is more specifically described with reference to Example and Comparative Example, but the present invention is not limited to these examples.

Example 1

Manufacture of Resin Composition for Forming Surface Resin Layer

To a component comprising 60 parts by mass of a cresol novolac type epoxy resin, 30 parts by mass of a phenol novolac resin, 400 parts by mass of spherical silica having an average particle diameter of 7 μm, 0.4 part by mass of a catalyst TPP (triphenylphosphine), 3 parts by mass of a black pigment, and 0.5 part by mass of a silane coupling agent (KBM403 available from Shin-Etsu Chemical Co., Ltd.) was added 1700 parts by mass of cyclohexanone, and these materials were mixed by stirring to obtain a resin varnish for forming a surface resin layer.
[Preparation of Base]

A BT (bismaleimide triazine) resin substrate (Glass transition temperature: 185° C.) having a thickness of 100 μm and a size of 66 mm×232 mm was prepared as a base.
[Manufacture of Resin Composition as Encapsulating Resin Layer]

60 parts by mass of a cresol novolac type epoxy resin, 30 parts by mass of a phenol novolac resin, 400 parts by mass of spherical silica having an average particle diameter of 7 μm, 0.2 part by mass of a catalyst TPP, and 0.5 part by mass of a silane coupling agent KBM403 (available from Shin-Etsu Chemical Co., Ltd.) were sufficiently mixed by a high-speed mixing apparatus, and kneaded under heating by a continuous kneading apparatus to make a sheet and cooled. The sheet was crushed to obtain an epoxy resin composition as granular powder.
[Manufacture of Encapsulant with Base for Use in Semiconductor Encapsulation]

The resin varnish obtained as mentioned above was coated by printing on the above-mentioned base, dried at 120° C. for 20 minutes, and then, post-cured at 180° C. for 4 hours to form a cured surface resin layer. The thickness of the surface resin layer was 0.7 µm. Then, granular powder of the above-mentioned epoxy resin composition was uniformly dispersed on the other surface of the base on which the surface resin layer has been formed. Temperatures of the upper and lower mold were set at 80° C., a PET film (peeling film) coated with a fluorine resin was set to the upper mold, and the pressure at the inside of the mold was reduced to a vacuum level and compression molding was carried out for 3 minutes so that a thickness of the resin became 600 µm to form an encapsulating resin layer. An encapsulant with a base for use in semiconductor encapsulation was manufactured as mentioned above.

[Preparation of Semiconductor Device Mounting Substrate]

A substrate in which 64 Si chips each having a thickness of 200 µm and a size of 10×10 mm had been mounted on a BT substrate having a thickness of 100 µm and a size of 74×240 mm was prepared.

[Encapsulating of Semiconductor Device Mounting Substrate]

By using the manufactured encapsulant with a base for use in semiconductor encapsulation, the above semiconductor device mounting substrate was encapsulated and then cured by vacuum compression molding using a vacuum lamination apparatus (manufactured by Nichigo-Morton Co., Ltd.) a plate temperature of which was set to 175° C. for 5 minutes. After curing and encapsulating, the resultant substrate was post-cured at 180° C. for 4 hours to obtain a semiconductor device mounting substrate after encapsulating.

Example 2

Manufacture of Resin Composition for Forming Surface Resin Layer

To a composition comprising 50 parts by mass of diorganopolysiloxane both ends of the molecular chain of which have been encapsulated by alkenyl groups as the organosilicon compound having a nonconjugated double bond, 50 parts by mass of organohydrogenpolysiloxane, 0.2 part by mass of an acetylene alcohol type ethynylcyclohexanol as the reaction inhibitor, and 0.1 part by mass of an octyl alcohol-modified solution of chloroplatinic acid, were added a composition comprising 350 parts by mass of spherical silica having an average particle diameter of 5 µm and 3 parts by mass of a black pigment, and 1600 parts by mass of toluene was further added and the resulting mixture was mixed by stirring to prepare a resin varnish for forming a surface resin layer.

[Preparation of Base]

A silicon wafer having a thickness of 200 µm and a diameter of 300 mm (12 inches) was prepared.

[Manufacture of Resin Composition as Encapsulating Resin Layer]

A resin composition was manufactured in the same manner as in Example 1.

[Manufacture of Encapsulant with Base for Use in Semiconductor Encapsulation]

An encapsulant with a base for use in semiconductor encapsulation was manufactured in the same manner as in Example 1. A thickness of the surface resin layer was 10 µm.

[Preparation of Semiconductor Device Mounting Substrate]

A 300 mm (12 inches) silicon wafer having a thickness of 200 µm on which 400 silicon chips (shape: 5 mm×7 mm, thickness: 100 µm) which were separated semiconductor devices into pieces have been arranged and mounted was prepared.

[Encapsulating of Semiconductor Device Mounting Substrate]

The semiconductor device mounting substrate was encapsulated under the same conditions as in Example 1 to obtain a semiconductor device mounting substrate after encapsulating.

Example 3

Manufacture of Resin Composition for Forming Surface Resin Layer 70 parts by mass of acryl modified-bisphenol A, 30 parts by mass of bisphenol A, 15 parts by mass of dicyandiamide, 2 parts by mass of oligo(2-hydroxy-2-methyl-1-(4-(1-methylvinyl)phenyl)propanone as a photopolymerization initiator, 400 parts by mass of spherical silica having an average particle diameter of 7 µm, 0.5 part by mass of KBM403 (γ-glycidoxypropyltrimethoxysilane) (available from Shin-Etsu Chemical Co., Ltd.) as a silane coupling agent, and 3 parts by mass of a black pigment were mixed under stirring to obtain an epoxy-acrylate resin composition for forking a surface resin layer.

[Preparation of Base]

A metal substrate having a thickness of 200 µm and a diameter of 300 mm (12 inches) was prepared.

[Manufacture of Resin Composition as Encapsulating Resin Layer]

A resin composition was manufactured in the same manner as in Example 1.

[Manufacture of Encapsulant with Base for Use in Semiconductor Encapsulation]

An encapsulant with a base for use in semiconductor encapsulation was manufactured in the same manner as in Example 1 except that the surface resin layer was formed by coating the above-mentioned epoxy-acrylate resin composition by printing on the base, photocuring the same under the conditions at an illumination intensity of 80 to 120 mW/cm$^2$ and a quantity of light of 2.0 to 3.0 J/cm$^2$ by an ultraviolet irradiation device, and curing under heating at 140° C. for 2 hours. A thickness of the surface resin layer was 70 µm.

[Preparation of Semiconductor Device Mounting Substrate]

A substrate in which 400 silicon chips (shape: 5 mm×7 mm, thickness: 125 µm) which were separated semiconductor devices into pieces have been arranged and mounted on a metal substrate having a thickness of 200 µm and a diameter of 300 mm (12 inches) through an adhesive an adhesive strength of which lowers at high temperatures was prepared.

[Encapsulating of Semiconductor Device Mounting Substrate]

The semiconductor device mounting substrate was encapsulated under the same conditions as in Example 1 to obtain a semiconductor device mounting substrate after encapsulating.

Example 4

Preparation of Resin Composition for Forming Surface Resin Layer

A polyimide silicone film X-45-5024B2 (available from Shin-Etsu Chemical Co., Ltd.) was prepared as a film for forming a surface resin layer.

[Preparation of Base]

A similar BT resin substrate to that of Example 1 was prepared.

[Manufacture of Resin Composition as Encapsulating Resin Layer]

A resin composition was manufactured in the same manner as in Example 1.

[Manufacture of Encapsulant with Base for Use in Semiconductor Encapsulation]

Onto the above-mentioned base was vacuum laminated a polyimide silicone film X-45-5024B2 at 70° C., and post-cured at 175° C. for 4 hours to manufacture an encapsulant with a base for use in semiconductor encapsulation. A thickness of the surface resin layer was 200 μm.

[Semiconductor Device Mounting Substrate]

The similar substrate as used in Example 1 was prepared.

[Encapsulating of Semiconductor Device Mounting Substrate]

The semiconductor device mounting substrate was encapsulated under the same conditions as in Example 1 to obtain a semiconductor device mounting substrate after encapsulating.

Comparative Example 1

A semiconductor device mounting substrate after encapsulating was obtained in the same manner as in Example 1 except for forming the surface resin layer.

Characteristics of the semiconductor device mounting substrates obtained in Examples 1 to 4 and Comparative Example 1, i.e., the semiconductor apparatuses before dicing were evaluated as mentioned below. The evaluation results are shown in Table 1.

[Appearance]

The surface of the semiconductor device mounting substrate after encapsulating was confirmed with naked eyes, and when no surface unevenness or roughness was observed, it was evaluated as good.

[Laser Marking Property]

To the surface resin layer of the semiconductor device mounting substrate after encapsulating was marked by a masking type YAG laser marking machine (under the conditions of applied voltage: 2.4 kV, pulse width: 120 us) manufactured by NEC Corporation, and visibility of the printing (marking property) was evaluated.

[Warp]

By using a laser three-dimensional measurement machine, displacement of the height of the semiconductor device mounting substrate after encapsulating was measured in the diagonal direction, and the difference in the displacement was made an amount of warp (mm).

TABLE 1

|  | Example 1 | Example 2 | Example 3 | Example 4 | Comparative Example 1 |
|---|---|---|---|---|---|
| Appearance | Good | Good | Good | Good | Bad |
| Laser Marking Property | Good | Good | Good | Good | Very bad |
| Warp(mm) | 0.1 | 0.1 | 0.1 | 0.2 | 0.1 |

From the results shown in Table 1, it could be shown that the semiconductor apparatuses using the encapsulant with a base for use in semiconductor encapsulation of the present invention were good in both of appearance and a laser marking property. On the other hand, the semiconductor apparatus of Comparative Example 1 did not have the surface resin layer of the present invention, and the base surface of the encapsulant was exposed so that it could be shown that appearance thereof was bad and further the laser marking property was also remarkably bad.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. An encapsulant with a base for use in semiconductor encapsulation, for collectively encapsulating a device mounting surface of a substrate on which semiconductor devices are mounted, or a device forming surface of a wafer on which semiconductor devices are formed, comprising
the base being a support substrate composed of an organic resin substrate or a silicon wafer, an encapsulating resin layer composed of an uncured or semi-cured thermosetting resin formed on one surface of the base, and a surface resin layer formed on the other surface of the base.

2. The encapsulant according to claim 1, wherein the surface resin layer is formed from any of a curable epoxy resin, a curable silicone resin, a curable epoxy-silicone hybrid resin, a curable epoxy (meth)acrylate, a curable (meth)acrylic resin or a curable polyimide resin.

3. The encapsulant according to claim 2, wherein the surface resin layer has a black color.

4. The encapsulant according to claim 3, wherein the surface resin layer is formed from a liquid resin by a printing method, a spray method, a coating method, or a film thermal compression bonding method and cured by heat or light.

5. The encapsulant according to claim 4, wherein a thickness of the surface resin layer is 0.5 μm or more.

6. A semiconductor apparatus obtained by collectively encapsulating a device mounting surface of a substrate on which semiconductor devices are mounted, or a device forming surface of a wafer on which semiconductor devices are formed by the encapsulating resin layer of the encapsulant according to claim 5, and
dicing the encapsulated substrate or wafer into each individual semiconductor apparatus.

7. The semiconductor apparatus according to claim 6, wherein the surface resin layer of the encapsulant has a marked surface.

8. A method for manufacturing a semiconductor apparatus, comprising the steps of:
a coating process of coating a device mounting surface of a substrate on which semiconductor devices are mounted, or a device forming surface of a wafer on which semiconductor devices are formed by the encapsulating resin layer of the encapsulant according to claim 5,
an encapsulating process of collectively encapsulating the device mounting surface or the device forming surface by heating and curing the encapsulating resin layer, and
a dicing process of dicing the encapsulated substrate on which semiconductor devices are mounted or the encapsulated wafer on which semiconductor devices are formed into each individual semiconductor apparatus.

9. The encapsulant according to claim 1, wherein the surface resin layer has a black color.

10. The encapsulant according to claim 1, wherein the surface resin layer is formed from a liquid resin by a printing method, a spray method, a coating method, or a film thermal compression bonding method and cured by heat or light.

11. The encapsulant according to claim 1, wherein a thickness of the surface resin layer is 0.5 µm or more.

12. A semiconductor apparatus obtained by
collectively encapsulating a device mounting surface of a substrate on which semiconductor devices are mounted, or a device forming surface of a wafer on which semiconductor devices are formed by the encapsulating resin layer of the encapsulant according to claim 1, and
dicing the encapsulated substrate or wafer into each individual semiconductor apparatus.

13. The semiconductor apparatus according to claim 12, wherein the surface resin layer of the encapsulant has a marked surface.

14. A method for manufacturing a semiconductor apparatus, comprising the steps of:
a coating process of coating a device mounting surface of a substrate on which semiconductor devices are mounted, or a device forming surface of a wafer on which semiconductor devices are formed by the encapsulating resin layer of the encapsulant according to claim 1,
an encapsulating process of collectively encapsulating the device mounting surface or the device forming surface by heating and curing the encapsulating resin layer, and
a dicing process of dicing the encapsulated substrate on which semiconductor devices are mounted or the encapsulated wafer on which semiconductor devices are formed into each individual semiconductor apparatus.

* * * * *